United States Patent [19]

Kuroki et al.

[11] Patent Number: 4,576,735
[45] Date of Patent: Mar. 18, 1986

[54] ELECTROCONDUCTIVE MOLYBDENUM PASTE

[75] Inventors: Takashi Kuroki; Tsuyoshi Fujita, both of Yokohama; Gyozo Toda, Hino; Shousaku Ishihara, Kamakura; Yoshiyuki Ohzawa, Hiratsuka, all of Japan

[73] Assignee: Hitachi, Ltd., Tokyo, Japan

[21] Appl. No.: 660,089

[22] Filed: Oct. 12, 1984

[30] Foreign Application Priority Data

Oct. 14, 1983 [JP] Japan ................. 58-190900

[51] Int. Cl.⁴ ............................................. H01B 1/02
[52] U.S. Cl. ..................... 252/512; 106/1.05; 106/193 M; 524/109; 524/262; 524/439
[58] Field of Search ............... 252/512, 500; 106/287.1, 1.05, 287.11, 287.14, 193 M; 428/901; 524/262, 109, 439

[56] References Cited

U.S. PATENT DOCUMENTS

| | | | |
|---|---|---|---|
| 3,661,595 | 5/1972 | Buck | 252/512 |
| 4,024,629 | 5/1977 | Lemoine et al. | 427/97 |
| 4,452,844 | 6/1984 | Prabhu et al. | 252/512 |
| 4,493,789 | 1/1985 | Ueyama et al. | 252/512 |

Primary Examiner—Josephine L. Barr
Attorney, Agent, or Firm—Antonelli, Terry & Wands

[57] ABSTRACT

An electroconductive molybdenum paste comprising 100 parts by weight of a mixture consisting of 68.0 to 89.2% by weight of molybdenum powders having an average particle size of 0.5 to 10 μm, 10.0 to 27.0% by weight of a solvent, and 0.8 to 5.0% by weight of a binder, 0.5 to 5.0 parts by weight of a gelling agent, and 0.5 to 4.0 parts by weight of a silane coupling agent can firmly fill throughholes of a green sheet without formation of clearances and hollows in the resulting conductors in the throughholes, with better surface roughness of the conductor surfaces in the throughholes, and without development of cracks near the throughholes.

4 Claims, 1 Drawing Figure

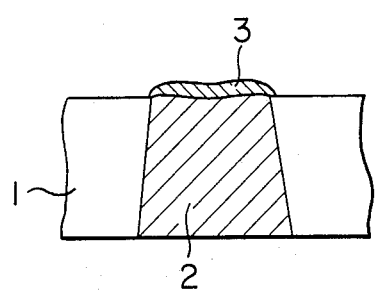

ELECTROCONDUCTIVE MOLYBDENUM PASTE

BACKGROUND OF THE INVENTION (1) Field of the Invention

This invention relates to an electroconductive paste, and particularly to an electroconductive molybdenum paste suitable for filling throughholes.

(2) Description of the Prior Art

Heretofore, multi-layered, ceramic circuit boards have been prepared by providing throughholes on a green sheet made from ceramic powders and an organic binder, printing on the green sheet an electroconductive paste, thereby forming an unfired circuit pattern thereon, filling the throughholes with the electroconductive paste, laying a desired number of the green sheets one upon another, pressing the sheets by a hot press, etc. and sintering the pressed sheets at 1,500° to 1,600° C.

The higher the circuit density and the LSI load density of the thus prepared ceramic circuit board, the larger the cracks developed near the throughholes.

To prevent the development of cracks, the following steps (1) to (5) have been proposed:

(1) To add $Al_2O_3$ to the paste to make the thermal expansion coefficient approach that of the ceramic.

(2) To add a low melting glass to the paste to lower the solidification temperature and reduce the residual stress.

(3) To increase the particle size of metal powders for use in the electroconductive paste to prevent sintering and disperse the thermal shock stress.

(4) To increase the mechanical strength of the ceramic.

(5) To use a plastically deformable metal as a conductor.

The electroconductive molybdenum pastes having the following compositions 1 and 2 are based on combinations of steps (1) and (5), and steps (1), (2) and (5), respectively.

Composition 1 (disclosed in Japanese Patent Publication No. 57-8799):

| | | |
|---|---|---|
| Mo powders (average particle size: 0.6 μm) | 100 g | |
| Mn powders | 0–6 g | 80 parts by weight |
| $Al_2O_3$ powders | 0–6 g | |
| n-butyl carbitol | | 10 parts by weight |
| ethyl cellulose | | 10 parts by weight |

Composition 2 (disclosed in Japanese Patent Application Kokai No. 51-80965):

| | | |
|---|---|---|
| Mo powders (average particle size: 1–3 μm) | 70 g | |
| Glass frits (42 wt. % $Al_2O_3$, 54 wt. % $SiO_2$, 2 wt. % CaO, 2 wt. % MgO) | 30 g | 67.5 parts by weight |
| Butyl carbitol acetate | | 7.5 parts by weight |
| Ethyl cellulose | | 20 parts by weight |
| Sarcosine | | 5 parts by weight |

By filling throughholes with said pastes, development of cracks near the throughholes can be prevented even if the circuit density and LSI load density are increased.

However, by filling the throughholes on the green sheet with said pastes, the solvent in the pastes is absorbed into the green sheets and the pastes undergo volumic shrinkage. The shrinkage is also occasioned by drying and firing. Total shrinkage amounts to 30–40%. Thus, voids can be formed in the filled electroconductive pastes or hollows can be formed on the surfaces of electroconductive pastes filled in the throughholes [surface roughness: 6–20 μm ($R_{max}$)]. Thus, (a) resistance becomes higher in the throughholes and at the contact surfaces of multi-layers, and (b) a plating film is hardly formed on the hollows on the electroconductive paste in the throughholes at the surface of a multi-layered board. Furthermore, when the paste is filled by printing, the Mo powders and the binder in the paste are separated from each other by the squeezing pressure, so that the Mo powders are coagulated to form deep clearances extending from the paste surface. The clearances remain in the surface layer even after sintering [surface roughness: 6–20 μm ($R_{max}$)], and when a plating layer is formed on such surface layer, the plating pretreatment solution and the plating solution are retained in the clearances under the plating layer. This leads to corrosion at the interface between the Mo conductor and the plating layer, and the resistance may be increased or the electrocontact may be deteriorated while actually used.

SUMMARY OF THE INVENTION

An object of the present invention is to provide an electroconductive molybdenum paste which can be firmly filled in throughholes.

According to the present invention, said object can be attained by making the electroconductive molybdenum paste less absorbable in the green sheet and the molybdenum powders less coagulating during the printing.

The present electroconductive molybdenum paste comprises a mixture of molybdenum powders, a solvent and a binder, further admixed with a gelling agent and a silane coupling agent, where 0.8 to 5.0 parts of the gelling agent and 0.5 to 4.0 parts by weight of the silane coupling agent are contained per 100 parts by weight of the mixture of the molybdenum powders, the solvent and the binder.

More particularly, 0.5 to 5.0 parts by weight of the gelling agent and 0.5 to 4.0 parts by weight of the silane coupling agent are added to 100 parts by weight of a mixture consisting of 68.0 to 89.2% by weight of molybdenum powders having an average particle size of 0.5 to 10 μm, 10.0 to 27.0% by weight of the solvent, and 0.8 to 5.0% by weight of the binder.

More preferably, 0.5 to 3.5 parts by weight of the gelling agent and 0.5 to 3.0 parts by weight of the silane coupling agent are added to 100 parts by weight of a mixture consisting of 80.0 to 89.2% by weight of molybdenum powders having an average particle size of 5 to 10 μm, 10.0 to 15.0% by weight of the solvent and 0.8 to 5.0% by weight of the binder.

Below 68% by weight of molybdenum powders, the amount of the solvent absorbable in the green sheet is increased and the green sheet near the throughholes adders to the screen printing plate, when screen printed. Thus, the green sheet is liable to be damaged when the screen printing plate is removed from the print surface.

Above 89.2% by weight of molybdenum powders, the electroconductive powder will have such a high viscosity that the printing is impossible to carry out.

Below 10% by weight of the solvent, the paste will have such a high viscosity that the printing is impossible to carry out, whereas, above 27.0% by weight, the green sheet is liable to be damaged when the screen printing plate is removed from the green sheet, as mentioned above.

Below 0.8% by weight of the binder, the electroconductive paste becomes hardly flowable, whereas, above 5.0% by weight, the green sheet is liable to be damaged when the screen printing plate is removed from the green sheet, as mentioned above.

Below 0.5 parts by weight of the gelling agent, the shrinkage by drying becomes larger, whereas, above 4.0 parts by weight, cracks will develop on the green sheets.

Below 0.5 parts by weight of the silane coupling agent the molybdenum powders are liable to coagulate, whereas above 5.0 parts by weight, the green sheet is liable to be damaged when the screen printing plate is removed from the green sheet, and the electroconductive molybdenum paste is liable to be retained in meshes or openings of the screen printing plate.

The gelling agent for use in the present invention is dibenzylidene-D-sorbitol.

The sliane coupling agent for use in the present invention includes γ-mercaptopropyltrimethoxysilane $HSC_3H_6.Si(OCH_3)_3$, N-β(aminoethyl)γ-aminopropyltrimethoxysilane $H_2NC_2H_4NHC_2H_6.Si(OCH_3)_2$, etc., and can be used alone or in their mixture.

The solvent for use in the present invention includes n-butyl carbitol acetate, α-terpineol, n-butyl carbinol, etc., and can be used alone or in their mixture.

The binder for use in the present invention includes ethyl cellulose, polyvinylbutyral, polymethylmethacrylate, polyethylmethacrylate, etc., and can be used alone or in their mixture.

The effects of using the gelling agent and the silane coupling agent will be described below:

When the gelling agent is used, (a) the electroconductive paste becomes very flowable and fillable into the throughholes of the green sheet, and not flowable after the filling, (b) the solvent in the electroconductive paste becomes not absorbable into the green sheet, (c) there is less shrinkage at drying of the green sheet, and (d) there is also less shrinkage at sintering.

When the silane coupling agent is used, (a) the silane coupling agent is adsorbed onto the surfaces of molybdenum powders to lower the activity of molybdenum and prevent the molybdenum powders from coagulation, (b) the Si atoms in the silane coupling agent seem to work as a sintering aid, and thus the electroconductive paste is liable to be sintered, and (c) the electroconductive paste can be prevented from adhesion to unwanted parts at printing.

The present invention will be described in detail below, referring to Examples and the accompanying drawing.

BRIEF DESCRIPTION OF THE DRAWING

FIGURE is a partial cross-sectional view of a ceramic circuit board according to one embodiment of the present invention.

DESCRIPTION OF THE PREFERRED EMBODIMENTS

In FIGURE, it is schematically shown that an electroconductive paste 1 of the present invention, as filled in a throughhole of green sheet 2 and sintered to form a conductor, is provided with a plating layer 3 on the sintered paste to form a ceramic circuit board.

EXAMPLE 1

68 g of molybdenum powders having an average particle size of 0.5 μm, 27 g of α-terpineol as a solvent, 5 g of ethyl cellulose as a binder, 0.5 g of $HSC_3H_6.Si(OCH_3)_3$ as a silane coupling agent, and 5 g of benzylidene-D-sorbitol as a gelling agent were mixed together and kneaded in a three-roller mill for 1.5 hours to obtain an electroconductive molybdenum paste.

Then, the paste was filled into throughholes each having a diameter of 0.15 mm, provided at the pitch of 0.25 mm on a green sheet of such a size as 150 mm×150 mm×0.25 mm by screen printing.

The green sheet filled with the molybdenum paste in the throughholes was dried at 150° C. for 30 minutes and sintered at 1,580° C. for one hour. The shrinkage at both drying and sintering was 1.0%.

No cleances and hollows were formed in the conductors in the throughholes, and the surface roughness of the conductor surfaces in the throughholes was 8 μm ($R_{max}$). No cracks were developed near the throughholes.

EXAMPLE 2

89.2 g of molybdenum powders having an average particle size of 10 μm, 10 g of n-butyl carbitol as a solvent, 0.8 g of polyvinyl butyral as a binder, 4.0 g of $H_2NC_2H_4NHC_3H_6$ as a silane coupling agent, and 0.5 g of benzylidene-D-sorbitol as a gelling agent were mixed together, and kneaded in a three-roller mill for 2 hours to obtain an electroconductive molybdenum paste.

The thus obtained paste was filled in the throughholes of the same green sheet, dried and sintered in the same manner as in Example 1.

The shrinkage at drying and sintering was 0.5%, and no clearances and hollows were formed in the conductors in the throughholes. The surface roughness of conductor surfaces in the throughholes was 3 μm ($R_{max}$). No cracks were developed near the throughholes.

EXAMPLE 3

76.0 g of molybdenum powders having an average particle size of 5 μm, 10 g of n-butyl carbitol acetate as a solvent, 2 g of ethyl cellulose as a binder, 2 g of $H_2NC_2H_4NHC_3H_6$ as a silane coupling agent, and 3 g of benzylidene-D-sorbitol as a gelling agent were mixed together and kneaded in a three-roller mill for 2 hours to obtain an electroconductive molybdenum paste.

The thus prepared paste was filled in the throughholes in the same green sheet, dried and sintered in the same manner as in Example 1.

Shrinkage at drying and sintering was 0.7%, and no clearances and hollows were formed in the conductors in the throughholes. The surface roughness of conductor surfaces in the throughholes was 5.5 μm ($R_{max}$), and no cracks were developed near the throughholes.

What is claimed is:

1. An electroconductive molybdenum paste which consists essentially of 100 parts by weight of a mixture consisting of 68.0 to 89.2% by weight of molybdenum powders having an average particle size of 0.5 to 10 μm, 10.0 to 27.0% by weight of a solvent, and 0.8 to 5.0% by weight of a binder, 0.5 to 5.0 parts by weight of dibenzylidene-D-sorbitol as a gelling agent, and 0.5 to 4.0 parts by weight of a silane coupling agent selected from the group consisting of at least one of $HSC_3H_6 \cdot Si(OCH_3)_3$ and $H_2NC_2H_4NHC_3H_6Si(OCH_3)_2$.

2. An electroconductive molybdenum paste according to claim 1, wherein the solvent is selected from the group consisting of at least one of n-butyl carbitol acetate, α-terpineol and n-butyl carbinol.

3. An electroconductive molybdenum paste according to claim 1, wherein the binder is selected from the group consisting of at least one of ethyl cellulose, polyvinylbutyral, polymethylmethacrylate and polyethylmethacrylate.

4. An electroconductive molybdenum paste according to claim 1, wherein said mixture consists of 80.0 to 89.2% by weight of molybdenum powders having an average particle size of 5 to 10 μm, 10.0 to 15.0% by weight of the solvent and 0.8 to 5.0% by weight of the binder, said mixture being admixed with 0.5 to 3.5 parts by weight of the gelling agent and 0.5 to 3.0 parts by weight of the coupling agent.

* * * * *